(12) United States Patent
Rijssemus et al.

(10) Patent No.: US 10,498,005 B2
(45) Date of Patent: Dec. 3, 2019

(54) CABLE TAP

(71) Applicant: TECHNETIX B.V., Veenendaal (NL)

(72) Inventors: Martien Rijssemus, Veenendaal (NL); Matthijs Laro, Veenendaal (NL)

(73) Assignee: Technetix B.V. (NL)

( * ) Notice: Subject to any disclaimer, the term of this patent is extended or adjusted under 35 U.S.C. 154(b) by 31 days.

(21) Appl. No.: 16/036,037

(22) Filed: Jul. 16, 2018

(65) Prior Publication Data

US 2019/0148809 A1  May 16, 2019

(30) Foreign Application Priority Data

Nov. 10, 2017  (GB) ................................... 1718584.4

(51) Int. Cl.
| | |
|---|---|
| *H01P 5/18* | (2006.01) |
| *H04N 7/10* | (2006.01) |
| *H04B 3/02* | (2006.01) |
| *H03H 7/48* | (2006.01) |
| *H01P 1/22* | (2006.01) |

(52) U.S. Cl.
CPC .............. *H01P 5/184* (2013.01); *H01P 1/227* (2013.01); *H03H 7/48* (2013.01); *H04B 3/02* (2013.01); *H04N 7/104* (2013.01)

(58) Field of Classification Search
CPC .. H01P 5/18; H01P 5/184; H04N 7/10; H04N 7/16
USPC .................. 333/109; 725/127, 149
See application file for complete search history.

(56) References Cited

U.S. PATENT DOCUMENTS

| | | | | |
|---|---|---|---|---|
| 6,560,778 | B1 * | 5/2003 | Hasegawa ............ | H05K 9/0007 |
| | | | | 174/359 |
| 7,721,317 | B2 * | 5/2010 | Pavlic ...................... | H03H 7/46 |
| | | | | 725/127 |
| 10,050,328 | B2 * | 8/2018 | Rijssemus ............... | H01P 5/184 |
| 10,103,420 | B2 * | 10/2018 | Boskaljon ................ | H03H 7/48 |
| 10,194,193 | B2 * | 1/2019 | Rijssemus ........... | H04N 21/426 |
| 2003/0093811 | A1 * | 5/2003 | Kaufman ................. | H03H 7/48 |
| | | | | 725/128 |

(Continued)

FOREIGN PATENT DOCUMENTS

GB  2544826  5/2017

OTHER PUBLICATIONS

Search Report issued in App. No. GB1718584.4 (dated May 9, 2018).

*Primary Examiner* — Dean O Takaoka
(74) *Attorney, Agent, or Firm* — Barnes & Thornburg LLP

(57) ABSTRACT

There is provided a cable tap device comprising a microstrip directional coupler having a first input port, a first output port, an isolation port and a first coupling port and a ferrite directional coupler having a second input port, a second output port and a second coupling port, wherein the microstrip directional coupler and the ferrite directional coupler are connected together to form a tap unit such that the first output port is connected to the second input port, the isolation port is connected to the second coupling port and the first coupling port connects to one or more tap ports. Capacitive elements can be associated with both types of directional coupler to prevent passage of low frequency signals through the directional couplers. Inductive elements to prevent passage of high frequency signals through the directional couplers.

7 Claims, 4 Drawing Sheets

(56) References Cited

U.S. PATENT DOCUMENTS

2005/0210529 A1 9/2005 Pavlic et al.
2005/0258917 A1 11/2005 Hubert

* cited by examiner

CABLE TAP

CROSS REFERENCE TO RELATED APPLICATIONS

This application claims priority to United Kingdom Patent Application No. 1718584.4, filed Nov. 10, 2017. The disclosure set forth in the referenced application is incorporated herein by reference in its entirety.

FIELD OF THE INVENTION

This invention relates to a cable tap for a cable network, and in particular to an outdoor tap.

BACKGROUND TO THE INVENTION

Many cable networks are built in a cascaded (tree and branch) structure. In cascaded networks, several amplifiers and taps are placed in series. The taps are used to drain a small part of the main distribution line signal to the house or user connections. In this type of cascaded network, the signal of the main line is attenuated at the end with respect to the beginning of the line. To address the varying attenuation, there are several types of tap models which tap more or less signal power depending on their position in the network. The first taps in the network tap less signal power from the main line, leaving more power for the following taps, with the last taps in the network tapping more signal power from the main line. These taps are known in the industry as "outdoor taps" as such a network is typically not mounted in cabinets, but on overhead strands, poles or on the walls of houses.

SUMMARY OF THE INVENTION

In accordance with the present invention, there is provided a cable tap device for use in a cable television (CATV) network, comprising a microstrip directional coupler having a first input port, a first output port, an isolation port and a first coupling port and a ferrite directional coupler having a second input port, a second output port and a second coupling port, wherein the microstrip directional coupler and the ferrite directional coupler are connected together to form a tap unit such that the first output port is connected to the second input port, the isolation port is connected to the second coupling port and the first coupling port connects to one or more tap ports. The microstrip directional coupler and the ferrite directional coupler are thus interconnected at two points. By connecting the microstrip directional coupler and ferrite core directional coupler electrically in series in this manner, the cable tap device has a low insertion loss when compared to a traditional or ferrite cable tap.

Preferably an input adapted to connect to a distribution line signal is attached to the first input port of the microstrip directional coupler and an output adapted to connect to the distribution line signal is connected to the second output port of the ferrite directional coupler.

The cable tap device is preferably bi-directional, allowing electrical signals to pass from the network provider to a user and for signals to be sent from the user to a network provider. The cable tap is preferably operable for signals in the frequency range 10 to 3000 MHz.

The first coupled port of the microstrip directional coupler may form a tap port connection, connecting to one or more splitters to supply a signal to a plurality of tap ports.

The cable tap device may further comprise a plurality of tap units connected in series, such that an output port of a ferrite directional coupler in the preceding tap unit in the series is connected to an input port of a microstrip directional coupler in the next tap unit in the series, with this connection repeated for all adjacent tap units. This results in a plurality of conjoined microstrip and ferrite directional couplers forming an interconnected cascade, with each tap unit comprising a microstrip directional coupler and ferrite directional coupler interconnected as aforesaid being connected to an equivalent tap unit next in the series. Typically the last tap unit in the series will have the output port of its ferrite directional coupler terminated by a resistive element.

Capacitive elements may be associated with both types of directional coupler to prevent passage of low frequency signals through the directional couplers. Typically a first capacitive element is disposed in a signal path connected to the input port of the microstrip directional coupler and a second capacitive element is disposed in a signal path leaving the output port of the ferrite directional coupler.

The cable tap device may further comprise inductive elements to prevent passage of high frequency signals through the directional couplers, such as an inductive power choke.

The invention will now be described by way of example with reference to the following drawings in which.

DESCRIPTION

Figure 1:
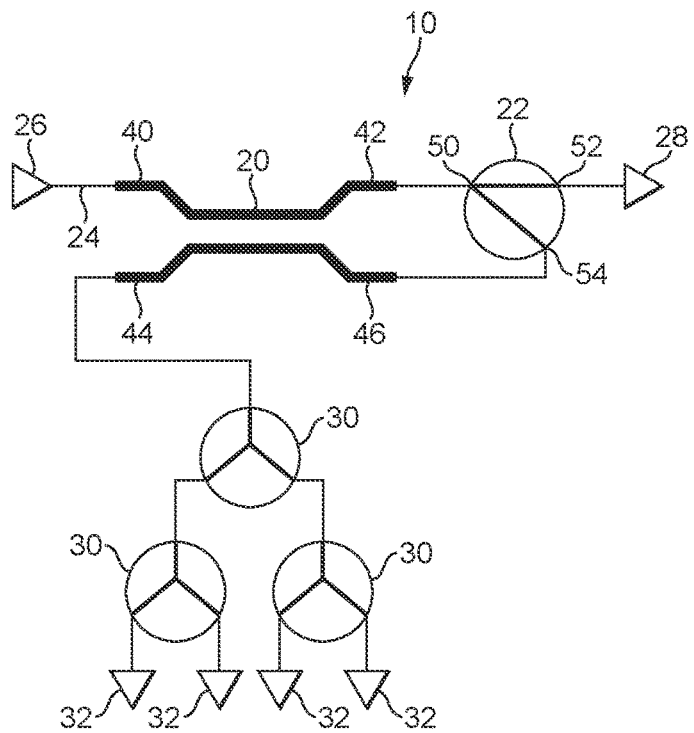
FIG. 1 is a schematic diagram of a first embodiment of a cable tap.

Broadband and data communication equipment connected to an in-home network receives downstream signals from a headend to a user and returns upstream signals to the headend for processing by the cable provider. FIG. 1 shows an outdoor tap for use in such broadband networks, with generally a plurality of taps positioned between a headend associated with a cable provider and a plurality of downstream users, typically in a cascaded structure as described above, so that each tap is connected to the main distribution line signal and taps signal power from the main line.

FIG. 1 shows a cable tap 10 comprising microstrip directional coupler 20 connected to ferrite directional coupler 22 within signal path 24 passing from input 26 to output 28 of the tap and through which a main distribution line supplied by a cable provider is routed. Tap 10 can be connected to a single tap port or, and as shown, be connected to one or more splitters 30 so as to supply a plurality of tap ports 32 with a four way tap shown, made with three splitters. The splitters can be of different architecture to achieve another N-way tap, for example two way, three way, four way, six way or eight way depending on the required number of tap ports for connection to users.

Microstrip directional coupler 20 consists of an input port 40, output port 42, coupled port 44 and isolation port 46. Ferrite directional coupler 22 consists of input port 50, output port 52 and coupled port 54. Microstrip directional coupler 20 and ferrite directional coupler 22 are connected together at two points, with output port 42 of microstrip directional coupler 20 connected to input port 50 of ferrite directional coupler 22 and isolation port 46 of microstrip directional coupler 20 connected to coupled port 54 of ferrite directional coupler 22. Coupled port 44 of microstrip directional coupler 20 forms the tap port connection for a single user or connects to one or more splitters to supply signal to a plurality of tap ports 32. Signal path 24 passes from input 26 to input port 40 and through output port 52 to reach to output 28.

Figure 2:
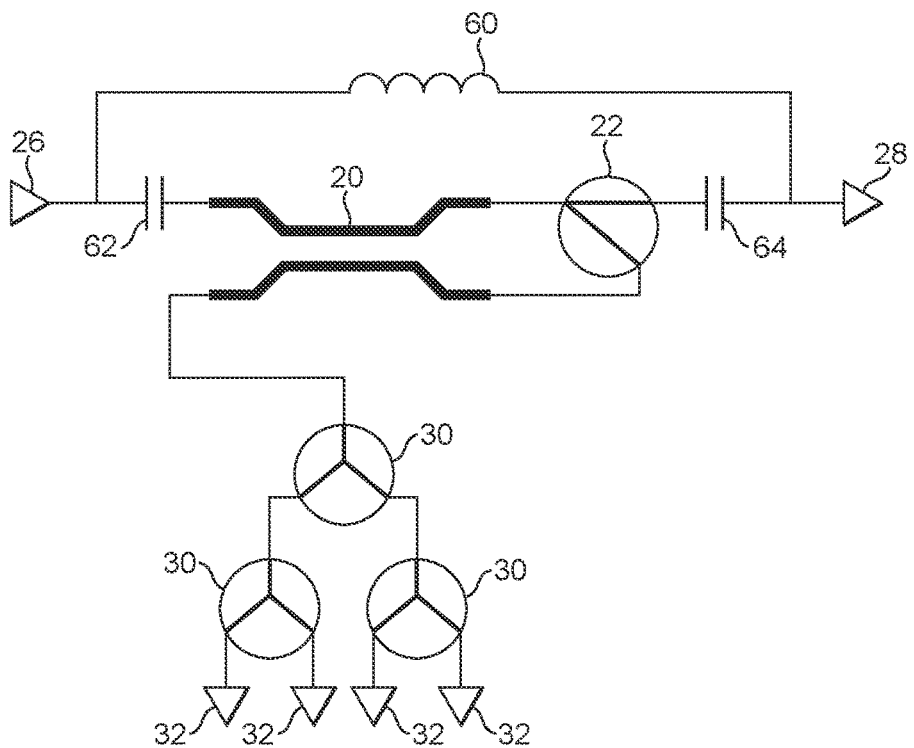
FIG. 2 is a schematic diagram of a second embodiment of a cable tap.

FIG. 2 shows a similar cable tap to FIG. 1 but includes power passing choke 60. Power choke 60 is required as these networks are powered using AC current of up to 10 Amp at 50 or 60 Hz passed along cable and ferrite directional coupler 22 is not capable of carrying any significant AC or DC current. Power choke 60 is a large inductor and bridges the RF components in taps. Capacitors 62, 64 act to block low frequency power signals from travelling through the directional couplers in an upstream or downstream direction.

Figure 3:
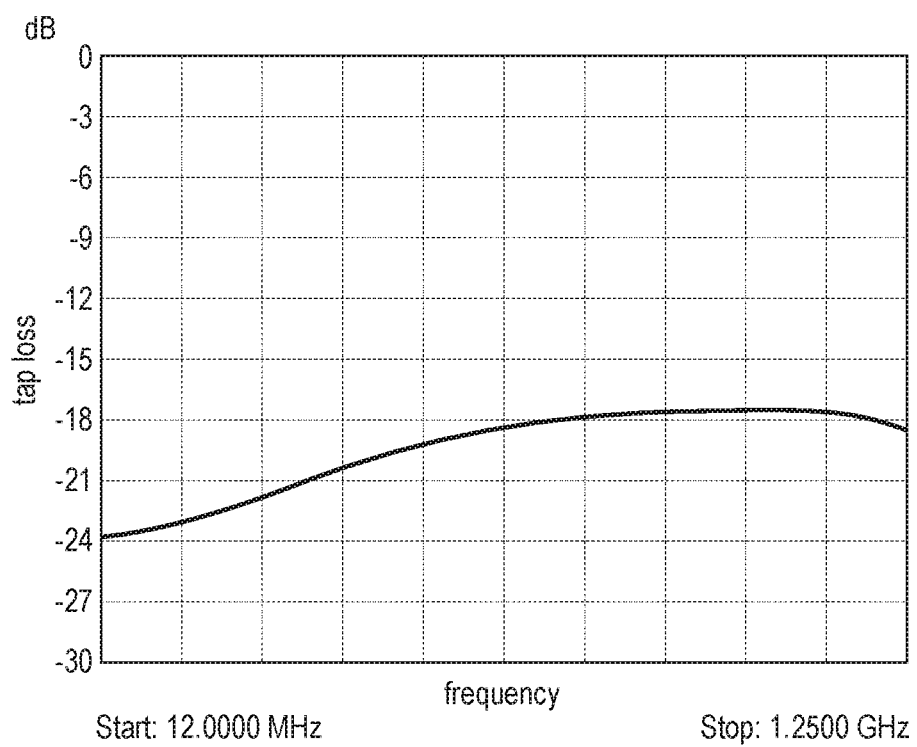
FIG. 3 is a graph illustrating, by way of example, loss characteristics for the tap shown in FIG. 2.

With the arrangement of the directly interconnected microstrip directional coupler 20 and ferrite directional coupler 22, ferrite coupler 22 taps signal power in the whole frequency band, and microstrip coupler 20 is used to tap only signal power in the upper frequency band. The combination of a low tap loss microstrip directional coupler 20 in series with a higher tap loss ferrite directional coupler 22 results in a tilted tap loss characteristic similar to that shown in FIG. 3 where an example of tap loss in dB is shown in relation to signal frequency to illustrate what is meant by tilted tap loss characteristic, although precise values will vary depending on the network and tap configuration. This results in a cable tap with low insertion loss when compared to a traditional all ferrite cable tap.

The tilted characteristic and the low insertion loss ensures the high frequency losses of the cable system are compensated at tap ports 32. The arrangement used makes the tilted tap characteristic possible without using filters such as diplex filters and with good directivity in the whole frequency band. Due to the lack of filters, the return loss will not degrade and ripple will not be added in the tap loss and insertion loss characteristic of the tap.

Figure 4:
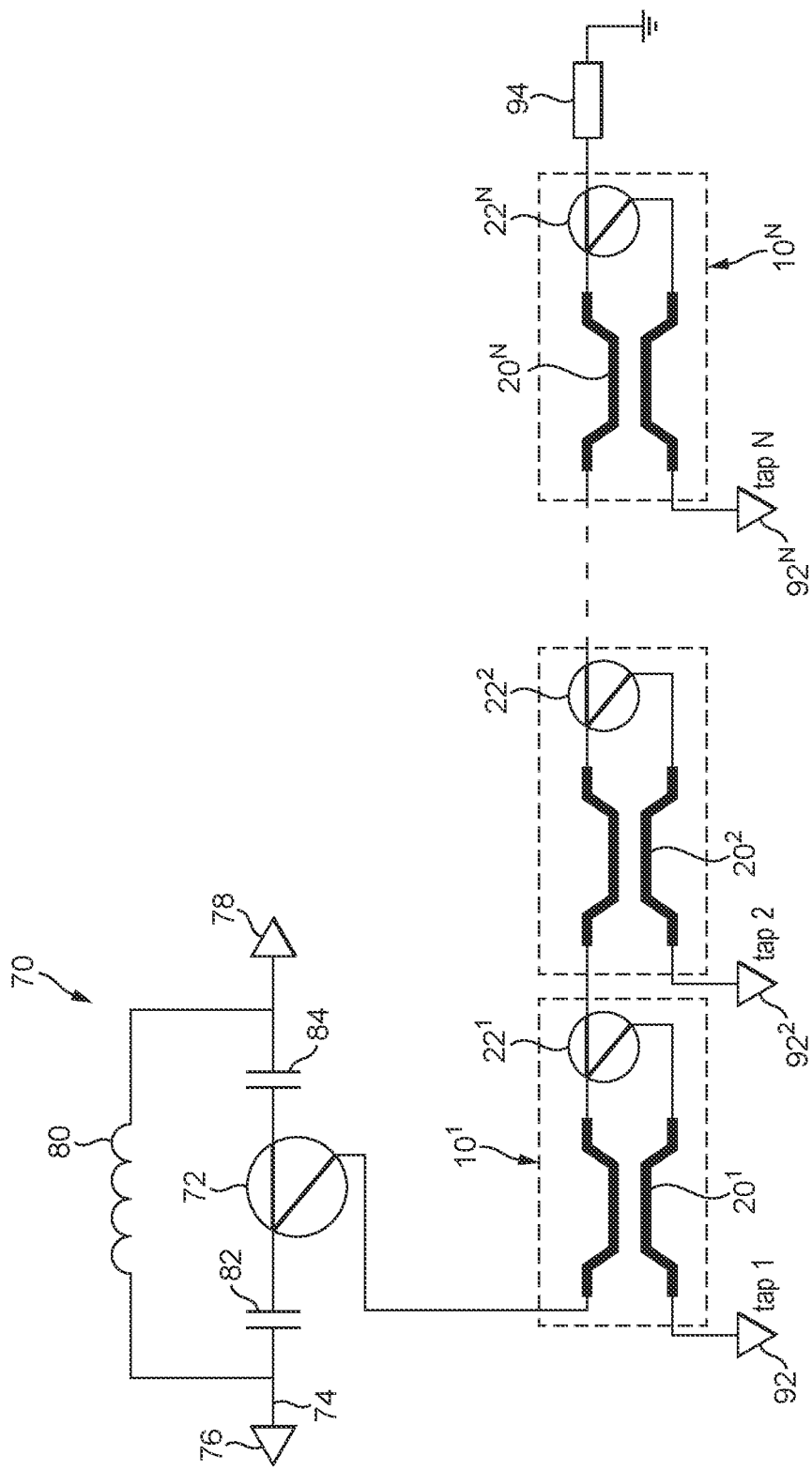
FIG. 4 is a schematic diagram illustrating a ferrite directional coupler combined with a series of cable taps.
Figure 5:
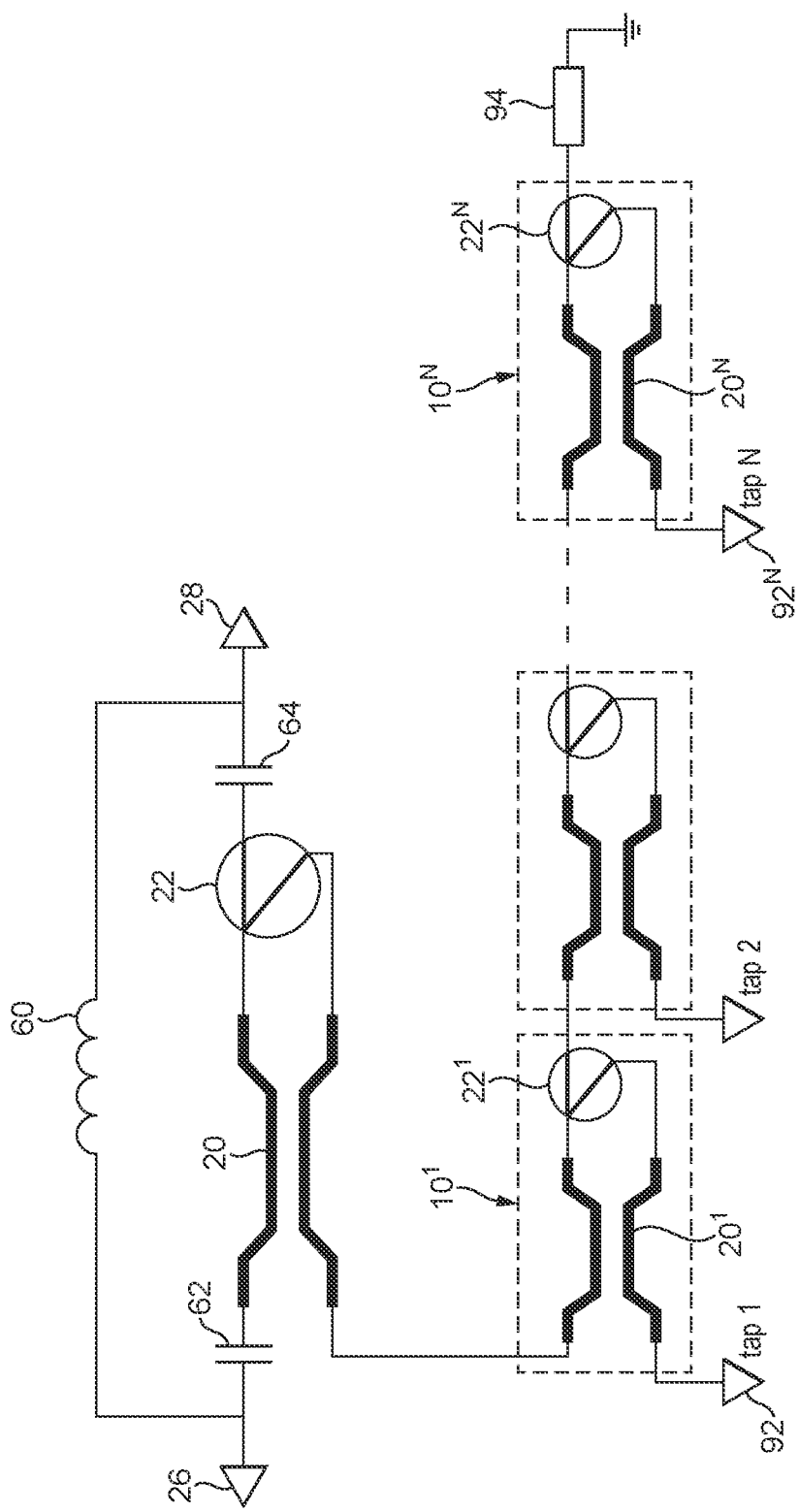
FIG. 5 is a schematic diagram illustrating use of multiple cable taps.

The taps of the present invention can be used in alternative configurations to achieve high tap port isolation, see for example the arrangements shown in FIGS. 4 and 5. High tap port isolation is necessary for some applications, like full-duplex DOCSIS (Data Over Cable Service Interface Specification).

In FIG. 4, a prior art outdoor tap 70 comprising a ferrite directional coupler 72 in the line 74 from signal input 76 to signal output 78 is bypassed by power choke 80, with capacitors 82, 84 disposed either side of ferrite coupler 72. Instead of using splitters to connect tap 70 to tap ports, N taps $10^1$ to $10^N$ in accordance with the first embodiment are connected in series, with each of the N taps supplying one tap port 92. In FIG. 5, an outdoor tap 100 in accordance with the second embodiment shown in FIG. 2 is combined with a series of N taps $10^1$ to $10^N$ in accordance with the first embodiment as shown in FIG. 1. For the arrangements shown in both FIGS. 4 and 5, each tap $10^1$ to $10^N$ is connected to the adjacent tap by connecting output port 52 of ferrite directional coupler 22 in the preceding tap to the input port 40 of microstrip directional coupler 20 in the next adjoining tap 10. At the end of the series of N taps, output port $52^N$ of the Nth ferrite directional coupler is connected to earth through resistor 94. In this way, the isolation of each tap port 92 to $92^N$ will be the directivity+tap loss. This results in a higher tap-to-tap port isolation compared to using splitters.

The circuits shown in FIGS. 1, 2, 4 and 5 are bi-directional allowing upstream and downstream signals to pass between the user and a headend associated with the network provider.

The invention claimed is:

1. A cable tap device comprising a microstrip directional coupler having a first input port, a first output port, an isolation port and a first coupling port and a ferrite directional coupler having a second input port, a second output port and a second coupling port, wherein the microstrip directional coupler and the ferrite directional coupler are connected together to form a tap unit such that the first output port is connected to the second input port, the isolation port is connected to the second coupling port and the first coupling port connects to one or more tap ports.

2. A cable tap device according to claim 1, wherein an input adapted to connect to a distribution line signal is attached to the first input port of the microstrip directional coupler and an output adapted to connect to the distribution line signal is connected to the second output port of the ferrite directional coupler.

3. A cable tap device according to claim 1, wherein the first coupled port of the microstrip directional coupler forms a tap port connection connecting to one or more splitters to supply a signal to a plurality of tap ports.

4. A cable tap device according to claim 1, further comprising a plurality of tap units connected in series, such that an output port of a ferrite directional coupler in the preceding tap unit in the series is connected to an input port of a microstrip directional coupler in the next tap unit in the series, with this connection repeated for all adjacent tap units.

5. A cable tap device according to claim 4, wherein the last tap unit in the series has the output port of its ferrite directional coupler terminated by a resistive element.

6. A cable tap device according to claim 1, wherein capacitive elements are associated with both types of directional coupler to prevent passage of low frequency signals through the directional couplers.

7. A cable tap device according to claim 1, further comprising inductive elements to prevent passage of high frequency signals through the directional couplers.

* * * * *